United States Patent [19]

Takanashi et al.

[11] Patent Number: 5,018,018
[45] Date of Patent: May 21, 1991

[54] APPARATUS FOR DETECTING DISTRIBUTION OF ELECTRIC SURFACE POTENTIAL

[75] Inventors: Itsuo Takanashi, Kamakura; Shintaro Nakagaki, Fujisawa; Hirohiko Shinonaga; Tsutou Asakura, both of Yokohama; Masato Furuya, Yokosuka, all of Japan

[73] Assignee: Victor Company of Japan, Ltd., Japan

[21] Appl. No.: 309,504

[22] Filed: Feb. 13, 1989

[30] Foreign Application Priority Data

Feb. 18, 1988 [JP] Japan .................................. 63-35524

[51] Int. Cl.$^5$ .............................................. H04N 3/14
[52] U.S. Cl. .......................... 358/213.11; 358/213.12; 358/213.29
[58] Field of Search ...................... 358/213.11, 213.29, 358/213.12

[56] References Cited

U.S. PATENT DOCUMENTS

| | | | |
|---|---|---|---|
| 4,319,284 | 3/1982 | Kiess et al. | 358/213.11 X |
| 4,626,916 | 12/1986 | Mizoguchi et al. | 358/213 |
| 4,644,402 | 2/1987 | Yamada | 358/213 |
| 4,806,779 | 2/1989 | Nakamura et al. | 250/578 |

Primary Examiner—James L. Dwyer
Assistant Examiner—M. Shehata
Attorney, Agent, or Firm—Lowe, Price, LeBlanc & Becker

[57] ABSTRACT

A plurality of field effect transistors are arranged in a line and have isolated open gates respectively. The gates are opposed to a surface of a charge storage medium and are subjected to respective induced voltages corresponding to a distribution of an electric surface potential of the medium. The transistors are enabled to output signals corresponding to the induced voltages respectively. The signals are sequentially transmitted from the transistors to an output terminal to generate an electric signal representative of the distribution of the electric surface potential of the medium.

21 Claims, 5 Drawing Sheets

APPARATUS FOR DETECTING DISTRIBUTION OF ELECTRIC SURFACE POTENTIAL

BACKGROUND OF THE INVENTION

This invention relates to an apparatus for detecting the distribution of an electric surface potential and generating an electric signal representative of the detected potential distribution.

In some image pickup systems, a photoelectric transducing section enables a charge storage member to be charged in accordance with an optical image of an object. The distribution of an electric surface potential of the charge storage member represents the optical image. For example, a surface potential sensor of an electrostatic induction type is usable in detecting the distribution of such an electric surface potential and generating a corresponding electric signal.

SUMMARY OF THE INVENTION

It is an object of this invention to provide a reliable and accurate apparatus for detecting the distribution of an electric surface potential.

In an apparatus of this invention, a plurality of field effect transistors are arranged in a line and have isolated open gates respectively. The gates are opposed to a surface of a medium and are subjected to respective induced voltages corresponding to a distribution of an electric surface potential of the medium. The transistors are enabled to output signals corresponding to the induced voltages respectively. The signals are sequentially transmitted from the transistors to an output terminal to generate an electric signal representative of the distribution of the electric surface potential of the medium.

DESCRIPTION OF THE PREFERRED EMBODIMENTS

Figure 1:
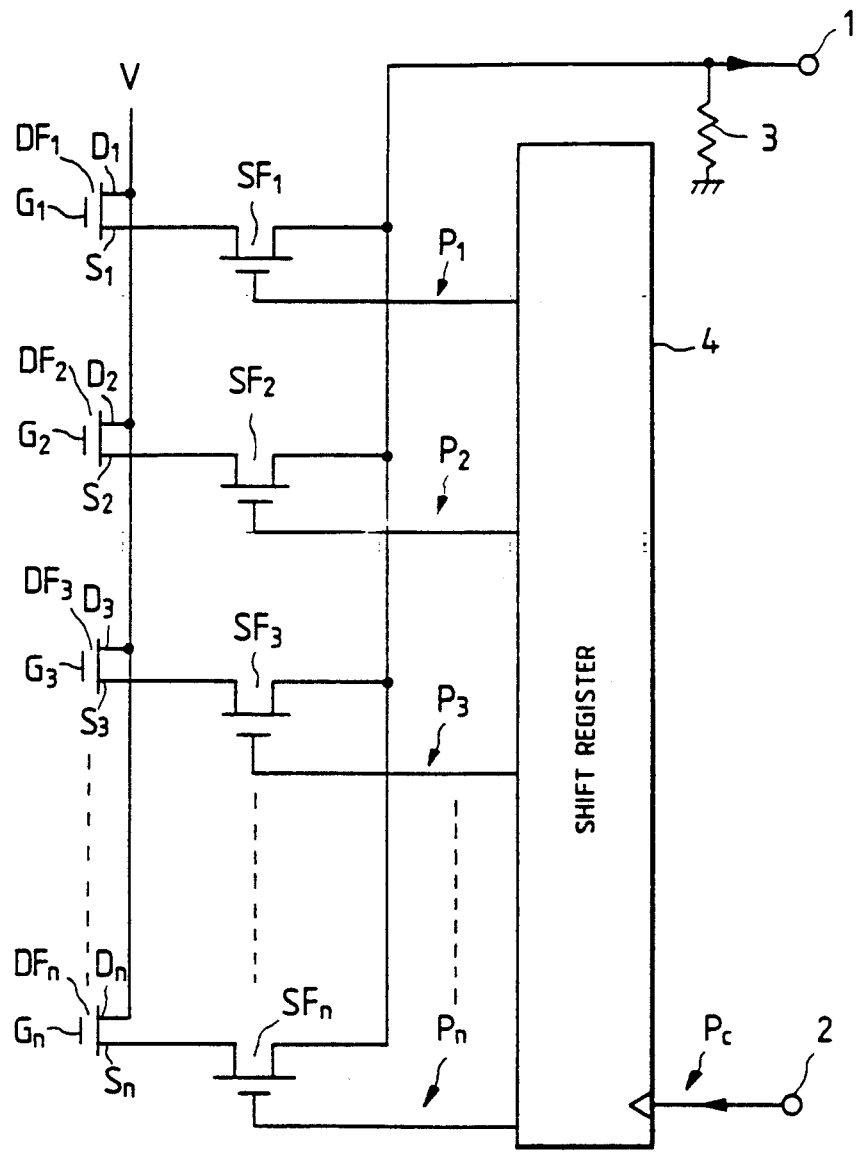
FIG. 1 is a diagram of an apparatus according to a first embodiment of this invention.

With reference to FIG. 1, an apparatus according to a first embodiment of this invention includes a linear array of field effect transistors DF1-DFn which have isolated open gates G1-Gn respectively. As will be made clear hereinafter, the transistors DF1-DFn serve as sensing elements. Accordingly, the transistors DF1-DFn are referred to as detecting transistors. The drains D1-Dn of the respective detecting transistors DF1-DFn are connected in common to a power supply (not shown) and are subjected to a constant voltage V. The sources S1-Sn of the detecting transistors DF1-DFn are connected to the drains of field effect transistors SF1-SFn respectively. As will be made clear hereinafter, the transistors SF1-SFn serve as switching elements. Accordingly, the transistors SF1-SFn are referred to as switching transistors. The sources of the switching transistors SF1-SFn are connected in common to an output signal line leading to an output terminal 1. The output terminal 1 is grounded via a load resistor 3.

The switching transistors SF1-SFn serve as switches connecting and disconnecting the detecting transistors DF1-DFn to and from the output terminal 1. In each of the switching transistors SF1-SFn, the source-drain path is made conductive and nonconductive when the gate receives a high level voltage and a low level voltage respectively. In other words, each of the switching transistors SF1-SFn is made on and off when its gate receives a high level voltage and a low level voltage respectively.

The gates of the switching transistors SF1-SFn are connected to respective output terminals of a shift register 4 and are thus subjected to output signals P1-Pn from the shift register 4 respectively. A clock terminal of the shift register 4 receives a clock signal Pc which takes a waveform as shown in FIG. 2.

Figure 2:
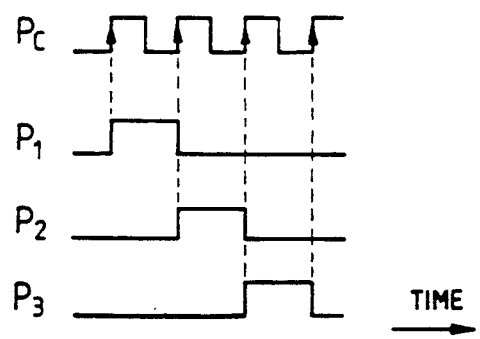
FIG. 2 is a timing diagram of input and output signals into and from the shift register of FIG. 1.

As shown in FIG. 2, the output signals P1-Pn from the shift register 4 sequentially assume high levels in response to the input clock signal Pc. Accordingly, the switching transistors SF1-SFn are sequentially made on in accordance with the clock signal Pc.

Figure 3:
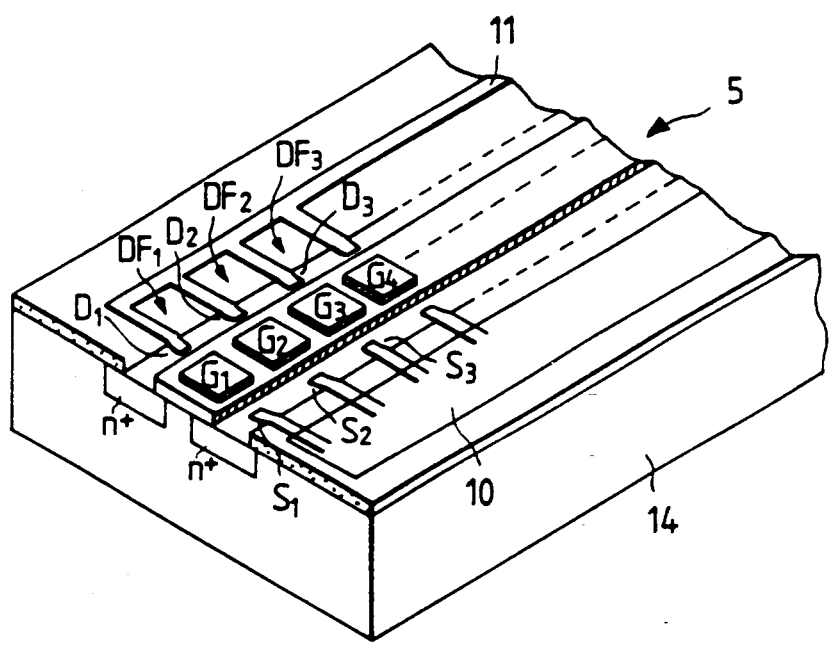
FIG. 3 is a perspective view of a sensing head of the apparatus of FIG. 1.

FIG. 3 shows a sensing head 5 of the apparatus. The sensing head 5 includes an integrated circuit in which the detecting transistors DF1-DFn and a switch region 10 are formed on a substrate 14. The switch region 10 includes an array of the switching transistors SF1-SFn (see FIG. 1). The detecting transistors DF1-DFn are arranged in a line. The gates G1-Gn of the detecting transistors DF1-DFn are square and are arranged in a line at equal intervals. The drains D1-Dn of the detecting transistors DF1-DFn are connected in common to a line 11 leading to a power supply (not shown). The sources S1-Sn of the detecting transistors DF1-DFn are connected to the switching transistors SF1-SFn within the switch region 10 respectively.

Figure 4:
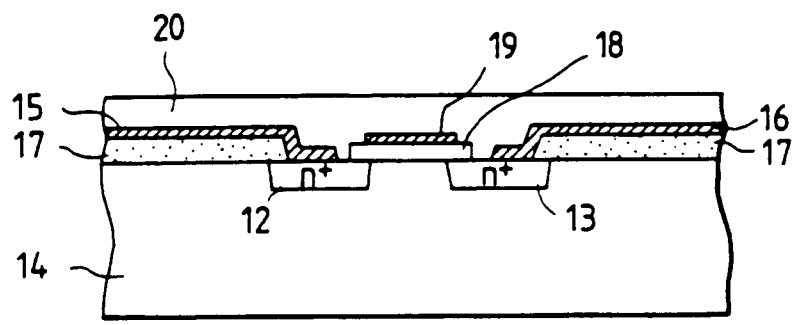
FIG. 4 is a sectional view of the sensing head of FIG. 3.

The designs of the detecting transistors DF1-DFn are similar. FIG. 4 shows a structure of the detecting transistors DF1-DFn. A pair of $n^+$ regions 12 and 13 formed in a p-type substrate 14 correspond to the drain and the source of the detecting transistor respectively. The $n^+$ regions 12 and 13 are spaced at a predetermined interval. Aluminum leads 15 and 16 connected to the respective $n^+$ regions 12 and 13 extend on an insulating layer 17 formed on the substrate 14. A metal oxide film 18 is formed on the portion of the substrate 14 between the $n^+$ regions 12 and 13. Opposite ends of the metal oxide film 18 reach ends of the $n^+$ regions 12 and 13 respectively. The gate 19 of the detecting transistor is formed on the metal oxide film 18. The gate 19 is open and isolated. A protective layer 20 of $SiO_2$ extends on the aluminum leads 15 and 16, and the gate 19.

The apparatus of the first embodiment operates as follows. The sensing head 5 is applied to a charge storage member or medium (not shown) having an electric surface potential whose distribution represents an optical image. Specifically, the gates G1-Gn of the detecting transistors DF1-DFn are opposed to an active surface of the medium. The protective layer 20 prevents the gates G1-Gn from directly contacting the medium. Electrostatic induction allows the gates G1-Gn to be subjected to voltages corresponding to surface potentials of portions of the medium which oppose the gates G1-Gn respectively. Accordingly, the linear array of the gates G1-Gn sense the electric surface potential of the corresponding linear portion of the medium.

As described previously, the switching transistors SF1-SFn are sequentially made on. Accordingly, voltage signals corresponding to the voltages of the gates G1-Gn of the detecting transistors DF1-DFn are sequentially transmitted from the sources S1-Sn of the detecting transistors DF1-DFn to the output terminal 1 via the source-drain paths of the switching transistors SF1-SFn. Thus, an output signal generated at the output terminal 1 has a time-dependent variation which corresponds to the distribution of the electric surface potential of the linear portion of the medium. In this way, the linear portion of the medium is scanned. The output signal which is generated at the output terminal 1 carries detected information in a time series manner.

After the transmission of the voltage signals from the detecting transistors DF1-DFn to the output terminal 1 is completed, that is, after the scan of the linear portion of the medium is completed, a suitable drive mechanism (not shown) moves the sensing head 5 relative to the medium by a predetermined distance in a direction perpendicular to the line of the gates G1-Gn of the detecting transistors DF1-DFn. In other words, the sensing head 5 is moved to a position corresponding to a subsequent linear portion of the medium which is close and parallel to the previous linear portion of the medium. Then, the subsequent linear portion of the medium is scanned in a manner similar to the scan of the previous linear portion of the medium. Specifically, the switching transistors SF1-SFn are sequentially driven so that voltage signals are sequentially transmitted from the detecting transistors DF1-DFn to the output terminal 1 in a manner similar to the previously-mentioned case.

Such processes are periodically reiterated until an effective area of the medium is scanned completely. During the scan of the effective area of the medium, the output signal which is generated at the output terminal 1 exhibits a time-dependent variation corresponding to the distribution of the electric surface potential at the effective area of the medium.

Figure 5:
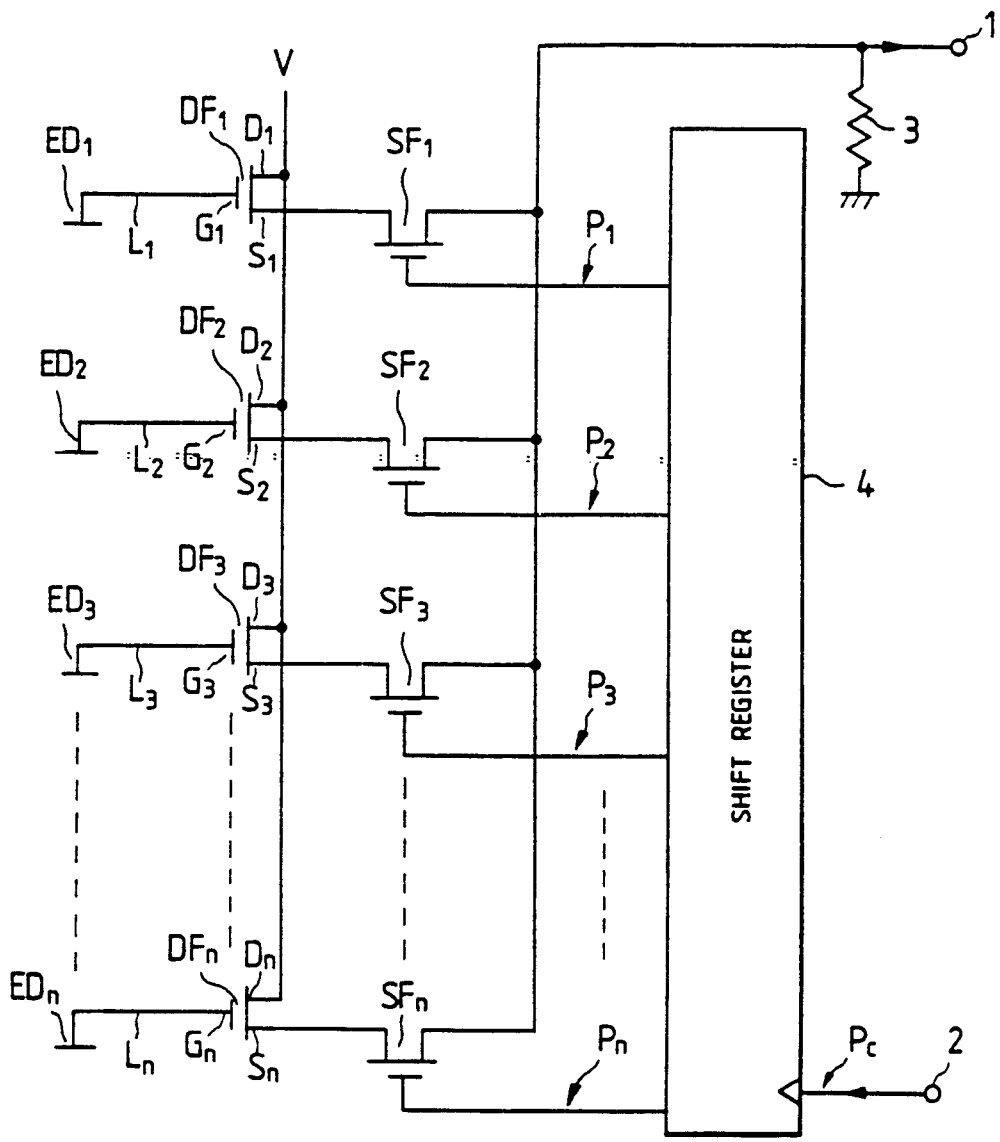
FIG. 5 is a diagram of an apparatus according to a second embodiment of this invention.
Figure 6:
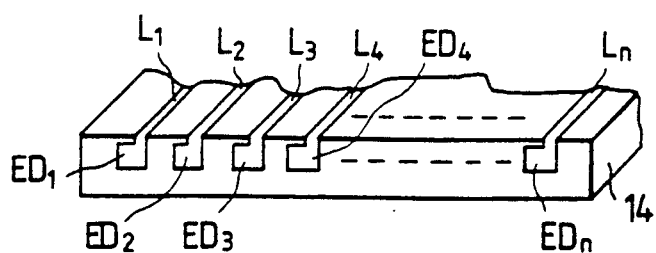
FIG. 6 is a perspective view of a sensing head of the apparatus of FIG. 5.

FIGS. 5 and 6 show a second embodiment of this invention which is similar to the embodiment of FIGS. 1-4 except for the following design changes.

In the embodiment of FIGS. 5 and 6, an integrated circuit substrate 14 is provided with a linear array of sensing electrodes ED1-EDn which are connected to gates G1-Gn of detecting transistors DF1-DFn via leads L1-Ln respectively. In operation, the sensing electrodes ED1-EDn are opposed to an active surface of the medium. Electrostatic induction allows the sensing electrodes ED1-EDn to be subjected to voltages corresponding to surface potentials of portions of the medium which oppose the sensing electrodes ED1-EDn. The induced voltages are transmitted from the sensing electrodes ED1-EDn to the gates G1-Gn of the detecting transistors DF1-DFn via the leads L1-Ln respectively. The sources S1-Sn of the detecting transistors DF1-DFn output voltage signals corresponding to the induced voltages at the sensing electrodes ED1-EDn respectively.

Figure 7:
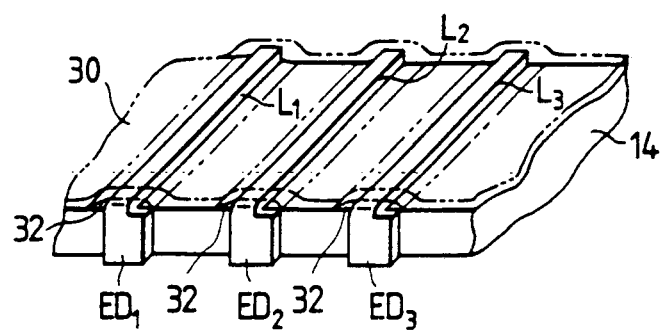
FIG. 7 is a perspective view of a sensing head of an apparatus according to a third embodiment of this invention.

FIG. 7 shows a third embodiment of this invention which is similar to the embodiment of FIGS. 5 and 6 except that leads L1-Ln are covered with an electrostatic shield 30. Specifically, insulating layers 32 are formed on the leads L1-Ln to coat the leads L1-Ln. The electrostatic shield 30 includes an electrically conductive layer formed on the insulating layers 32. The electrostatic shield 30 prevents the voltages, which are transmitted via the leads L1-Ln, from being contaminated by noises.

Figure 8:
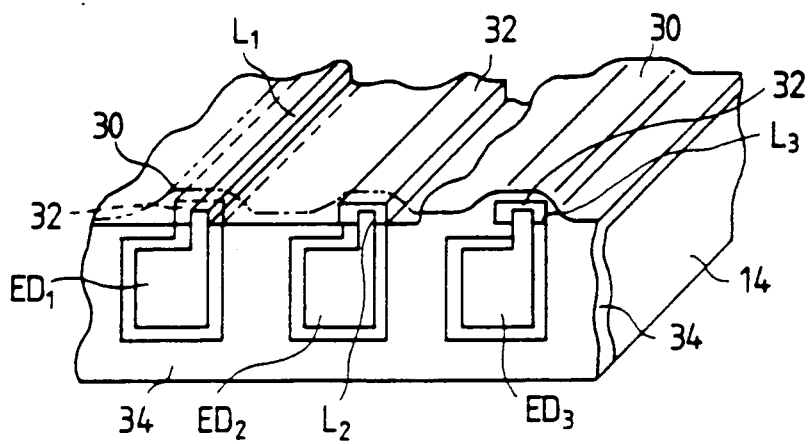
FIG. 8 is a perspective view of a sensing head of an apparatus according to a fourth embodiment of this invention.

FIG. 8 shows a fourth embodiment of this invention which is similar to the embodiment of FIG. 7 except that an electrostatic shield 34 made of an electrically conductive layer is formed between sensing electrodes ED1-EDn. The electrostatic shied 34 suppresses crosstalk between voltages induced at adjacent sensing electrodes.

Figure 9:
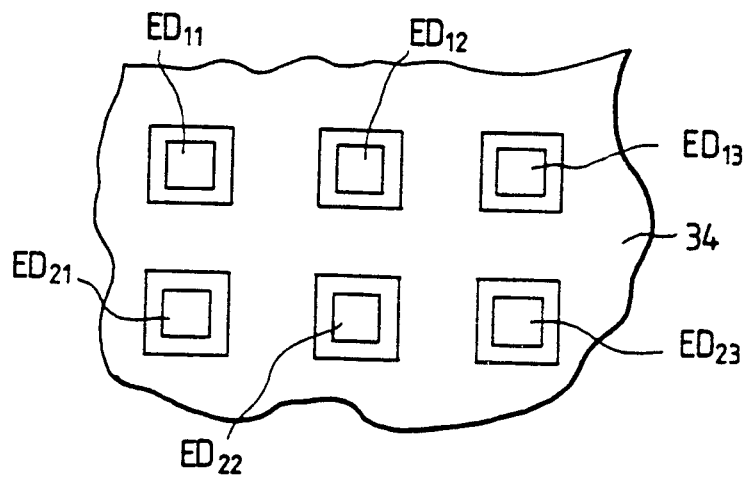
FIG. 9 is a front view of a sensing head of an apparatus according to a fifth embodiment of this invention.

FIG. 9 shows a fifth embodiment of this invention which is similar to the embodiment of FIG. 8 except for the following design changes. The embodiment of FIG. 9 includes a two-dimensional array of sensing electrodes ED11-EDnn which are connected to respective detecting transistors. The detecting transistors are connected to an output terminal via respective switching transistors. The switching transistors are sequentially activated by pulses from two shift registers so that an active surface of the medium is scanned two-dimensionally.

Figure 10:
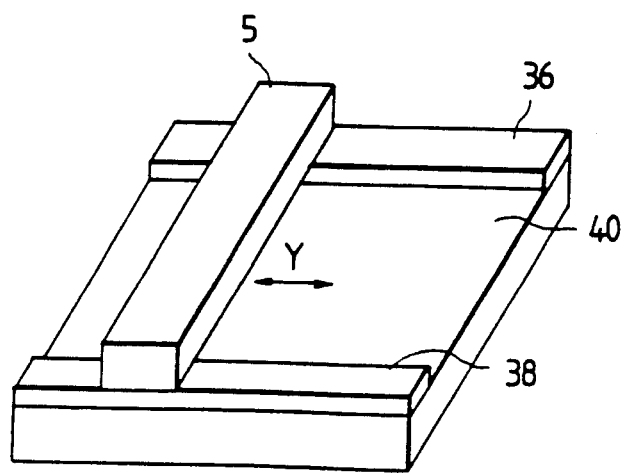
FIG. 10 is a perspective view of a sensing head, spacers, and medium in an apparatus according to a sixth embodiment of this invention.

FIG. 10 shows a sixth embodiment of this invention which is similar to the embodiment of FIG. 8 except for the following design changes. In the embodiment of FIG. 10, a pair of parallel spacers 36 and 38 are provided between a sensing head 5 and medium 40. The spacers 36 and 38 serve to hold constant the distance between the sensing head 5 and the medium 40 independent of the position of the sensing head 5 relative to the medium 40. The spacers 36 and 38 extend parallel to both directions Y of the movement of the sensing head 5 relative to the medium 40.

What is claimed is:

1. An apparatus for detecting a distribution of an electric surface potential of a medium, comprising:
   a plurality of field effect transistors having gates respectively;
   means for enabling said gates being subjected to respective induced voltages corresponding to the distribution of the electric surface potential of the medium;
   means for allowing the transistors to output signals corresponding to the induced voltages respectively;
   an output terminal; and
   means for sequentially transmitting the signals from the transistors to the output terminal to generate an electric signal representative of the distribution of the electric surface potential of the medium,
   wherein each of the gates of the transistors is open and isolated so that no conductive connection is provided to each of the gates.

2. The apparatus of claim 1 in which said gates are aligned in line and said enabling means is a linear array of surfaces correspondingly provided to said gates so as to oppose to a surface of the medium.

3. The apparatus of claim 1 wherein said signal-transmitting means comprises:

switches connected between the transistors and the output terminal for connecting and disconnecting the transistors to and from the output terminal respectively, wherein input sides of the switches are connected to the respective transistors and output sides of the switches are connected in common to be output terminal; and means for sequentially driving the switches and thereby sequentially transmitting the signals from the transistors to the output terminal to generate an electric signal whose time dependency corresponds to the distribution of the electric surface potential of the medium.

4. An apparatus for detecting a distribution of an electric surface potential of a charge storage medium, comprising:

a plurality of field effect transistors having gates respectively;

means for enabling said gates being subjected to respective induced voltages corresponding to the distribution of the electric surface potential of the medium;

means for allowing the transistors to output signals corresponding to the induced voltages respectively;

an output terminal; and means for sequentially transmitting the signals from the transistors to the output terminal to generate an electric signal representative of the distribution of the electric surface potential of the medium, wherein said signal-transmitting means includes:

switches connected between the transistors and the output terminal for connecting and disconnecting the transistors to and from the output terminal respectively, wherein input sides of the switches are connected to the respective transistors and output sides of the switches are connected in common to the output terminal; and means for sequentially driving the switches and thereby sequentially transmitting the signals from the transistors to the output terminal to generate an electric signal whose time dependency corresponds to the distribution of the electric surface potential of the medium, and wherein: the switches comprise a plurality of second field effect transistors;

drains of the second transistors are connected to sources of the first transistors;

sources of the second transistors are connected in common to the output terminal; and gates of the second transistors are connected to the switch driving means.

5. The apparatus of claim 4 wherein the switch driving means comprises means for sequentially applying pulses to the gates of the second transistors.

6. The apparatus of claim 2 further comprising a protective layer made of insulating material and covering said linear array of surfaces correspondingly provided to the gates of the transistors to prevent the surfaces of the gates from directly contacting the medium.

7. An apparatus for detecting a distribution of an electric surface potential of a medium, comprising:

a plurality of field effect transistors having gates respectively;

means for enabling said gates being subjected to respective induced voltages corresponding to the distribution of the electric surface potential of the medium;

means for allowing the transistors to output signals corresponding to the induced voltages respectively;

an output terminal; and means for sequentially transmitting the signals from the transistors to the output terminal to generate an electric signal representative of the distribution of the electric surface potential of the medium, wherein said gates are aligned in line and said enabling means is a linear array of surfaces correspondingly provided to said gates so as to oppose a surface of the medium, wherein each of the gates of the transistors is open and isolated so that no conductive connection is provided to said each of the gates.

8. The apparatus of claim 1 further comprising a substrate on which said transistors are formed, said enabling means including a linear array of sensing electrodes formed on the substrate, said leads formed on the substrate and connecting said sensing electrodes to the respective gates, and said sensing electrodes opposing to a surface of the medium.

9. The apparatus of claim 8 further comprising an electrostatic shield covering said leads.

10. The apparatus of claim 8 further comprising an electrostatic shield formed between said sensing electrodes.

11. The apparatus of claim 1 further comprising a substrate on which said transistors are formed, said enabling means including a two-dimensional array of sensing electrodes formed on the substrate so as to oppose to the medium, the sensing electrodes being connected to said gates of the transistors respectively.

12. An apparatus for detecting a distribution of an electric surface potential of a medium, comprising:

a plurality of field effect transistors having gates respectively;

means for enabling said gates being subjected to respective induced voltages corresponding to the distribution of the electric surface potential of the medium;

means for allowing the transistors to output signals corresponding to the induced voltages respectively;

an output terminal;

means for sequentially transmitting the signals from the transistors to the output terminal to generate an electric signal representative of the distribution of the electric surface potential of the medium; and a sensing head carrying said transistors and said enabling means, and spacers provided between the sensing head and the medium.

13. An apparatus for detecting a distribution of an electric surface potential of a medium, comprising:

a substrate having a surface opposing the medium;

a plurality of field effect transistors formed on the substrate and having gates respectively, the gates being exposed and formed at said surface of the substrate;

an output terminal;

means for sequentially transmitting output signals from the transistors to the output terminal, the output signals depending voltages which are induced at the gates in correspondence with the electric surface potential of the medium, and a sensing head carrying said transistors and said means for sequentially transmitting, and spacers provided between the sensing head and the medium.

14. The apparatus of claim 13 in which said gates are aligned in line.

15. The apparatus of claim 13 wherein said means for sequentially transmitting comprises:
switches connected between the transistors and the output terminal for connecting and disconnecting the transistors to and from the output terminal respectively, wherein input sides of the switches are connected to the respective transistors and output sides of the switches are connected in common to the output terminal; and
means for sequentially driving the switches and thereby sequentially transmitting the signals from the transistors to the output terminal to generate an electric signal whose time dependency corresponds to the distribution of the electric surface potential of the medium.

16. An apparatus for detecting a distribution of an electric surface potential of a medium, comprising:
a substrate having a surface opposing the medium;
a plurality of field effect transistors formed on the substrate and having gates respectively, the gates being exposed and formed at said surface of the substrate;
an output terminal; and
means for sequentially transmitting output signals from the transistors to the output terminal, the output signals depending on voltages which are induced at the gates in correspondence with the electric surface potential of the medium,
said means for sequentially transmitting including:
switches connected between the transistors and the output terminal for connecting and disconnecting the transistors to and from the output terminal respectively, wherein input sides of the switches are connected to the respective transistors and output sides of the switches are connected in common to the output terminal; and
means for sequentially driving the switches and thereby sequentially transmitting the signals from the transistors to the output terminal to generate an electric signal whose time dependency corresponds to the distribution of the electric surface potential of the medium,
wherein the switches comprise a plurality of second field effect transistors; drains of the second transistors are connected to sources of the first transistors; sources of the second transistors are connected in common to the output terminal; and gates of the second transistors are connected to the switch driving means.

17. The apparatus of claim 16 wherein the switch driving means comprises means for sequentially applying pulses to the gates of the second transistors.

18. The apparatus of claim 14 further comprising a protective layer covering the gates of the transistors to prevent the surfaces of the gates from directly contacting the medium.

19. An apparatus for detecting a distribution of an electric surface potential of a medium, comprising:
a substrate having a surface opposing the medium;
a plurality of field effect transistors formed on the substrate and having gates respectively, the gates being exposed and formed at said surface of the substrate;
said gates being aligned in line;
an output terminal;
means for sequentially transmitting output signals from the transistors to the output terminal, the output signals depending on voltages which are induced at the gates in correspondence with the electric surface potential of the medium,
wherein each of the gates of the transistors is open and isolated so that no conductive connection is provided to said each of the gates.

20. The apparatus of claim 13 further comprising a substrate on which said transistors are formed, said means for sequentially transmitting including a linear array of sensing electrodes formed on the substrate, and leads formed on the substrate and connecting said sensing electrodes to the respective gates, and said sensing electrodes opposing to a surface of the medium.

21. The apparatus of claim 13 further comprising a substrate on which said transistors are formed, said means for sequentially transmitting including a two-dimensional array of sensing electrodes formed on the substrate so as to oppose to the medium, the sensing electrodes being connected to said gates of the transistors respectively.

* * * * *